United States Patent [19]

Hsu

[11] Patent Number: 6,114,194
[45] Date of Patent: Sep. 5, 2000

[54] METHOD FOR FABRICATING A FIELD DEVICE TRANSISTOR

[75] Inventor: Chen-Chung Hsu, Taichung, Taiwan

[73] Assignee: United Microelectronics Corp., Hsinchu, Taiwan

[21] Appl. No.: 09/192,561

[22] Filed: Nov. 17, 1998

[51] Int. Cl.[7] .................................................. H01L 21/339
[52] U.S. Cl. ...................... 438/145; 438/225; 438/233; 438/270; 438/268; 438/297; 438/424; 438/425; 438/430; 438/439; 438/637
[58] Field of Search ..................... 438/145, 171, 438/190, 200, 210, 225, 233, 238, 269, 270, 268, 297, 424, 425, 430, 439, 637

[56] References Cited

U.S. PATENT DOCUMENTS

| | | |
|---|---|---|
| 4,602,267 | 7/1986 | Shirato . |
| 5,371,395 | 12/1994 | Hawkins . |
| 5,885,875 | 3/1999 | Hsu . |
| 5,888,880 | 3/1999 | Gardner et al. . |
| 5,895,958 | 4/1999 | Miki . |
| 5,946,573 | 8/1999 | Hsu . |
| 5,946,577 | 8/1999 | Tanaka . |
| 5,960,290 | 9/1999 | Hsu . |
| 5,972,775 | 10/1999 | Chen . |
| 5,972,778 | 10/1999 | Hamada . |
| 5,982,600 | 11/1999 | Cheng . |
| 5,994,190 | 11/1999 | Hashimoto . |
| 6,008,137 | 12/1999 | Lee et al. . |
| 6,013,559 | 1/2000 | Wu et al. . |
| 6,022,778 | 2/2000 | Contiero et al. . |
| 6,033,969 | 3/2000 | Yoo et al. . |
| 6,040,222 | 3/2000 | Hsu et al. . |

*Primary Examiner*—John F. Niebling
*Assistant Examiner*—Jonathan Hack
*Attorney, Agent, or Firm*—Oblon, Spivak, McClelland, Maier & Neustadt, P.C.

[57] ABSTRACT

A method for fabricating a field device transistor includes forming a gate oxide layer of the field device transistor by performing a thermal oxidation process. By properly controlling the thickness of the gate oxide layer, the threshold voltage of the field device transistor can be suppressed in under 5 volts to provide sufficient protection for the internal circuit. The method of the invention includes forming a gate oxide layer of a field device transistor by performing a thermal oxidation process instead of a field oxide layer in order to obtain a better control on the thickness of the gate oxide layer.

14 Claims, 5 Drawing Sheets

METHOD FOR FABRICATING A FIELD DEVICE TRANSISTOR

BACKGROUND OF THE INVENTION

1. Field of the Invention

This invention relates to a method for fabricating a semiconductor device, and more particularly, to a method for fabricating a field device transistor.

2. Description of Related Art

Electrostatic discharge (EDS) has been one of the major causes of damage to integrated circuits in semiconductor fabrication process. In a deep sub-micron integrated circuit, the degree to which EDS causes the malfunction of an integrated circuit is even more serious and may result in damage to the circuit. In order to overcome the problems caused by the EDS, an on-chip EDS protection circuit is added to the pads at the output end and input end of a complement metal-oxide-semiconductor (CMOS). However, because of to the progress in the field of semiconductor fabrication, the protection provided by the EDS protection circuit no longer meets the real need.

A conventional ESD protection circuit including a field device transistor is shown in FIG. 1. Referring to FIG. 1, static voltage or over-stress voltage at the input port I/P is discharged through the field device transistor 10 to the ground $V_{SS}$. The input buffer gate 12 and the internal circuit 14 are under the protection of the field device transistor 10.

A schematic, cross-sectional view of the field device transistor 10 in FIG. 1 is shown in FIG. 2. Referring to FIG. 2, a conventional field device transistor includes a gate 25, a source region 22 and a drain region 23 formed on a substrate 20, and a field oxide layer 24 located between the source region 22 and the drain region 23. For a N-type field device transistor, a heavily doped P-type region 26 is formed under the field oxide layer 24. The source region 22 is grounded by connected to a ground $V_{SS}$ (FIG. 1) through an interconnect 27. In the meantime, the gate and the drain region 23 are connected to the input port I/P and the buffer input gate 12 in FIG. 1 through the interconnect 27 in order to protect the internal circuit 14 from ESD and over-stress voltage.

When an over-stress voltage signal appears at the input port I/P, the field device 10 bypasses the over-stress voltage signal by applying a punch-through effect. Since the punch-through effect on the field device transistor 10 acts faster than the junction breakdown thereon according to a over-stress voltage signal, the field device transistor 10 can be used as a protection to prevent breakdown from occurring on low-voltage gate oxide layers in the internal circuit.

However, a heavy P-type implantation process is conventionally used to improve the isolation between devices. The heavy P-type implantation also forms a P-type heavily doped region 26 located underneath the field oxide 24 of the field device transistor 10. Hence, the threshold voltage $V_T$ of the field device transistor 10 is normally as high as about 12 to 14 volts. For a gate oxide layer whose thickness is below 50 Å, which gate oxide layer normally has a breakdown voltage of about 5 to 6 volts, a conventional field device transistor 10 cannot provide sufficient protection.

SUMMARY OF THE INVENTION

It is therefore an objective of the present invention to provide a method for forming a field device transistor having a low threshold voltage that increases the response of a ESD protection circuit to an over-stress voltage signal.

It is another an objective of the present invention to provide a method for forming a field device transistor that has a threshold voltage, which is adjustable according to the thickness of the field oxide layer.

In order to efficiently bypass an abnormally surging voltage before it is fed into an internal circuit, the threshold $V_T$ of the field device transistor 10 of an ESD protection circuit shown in FIG. 1 has to be lower than the breakdown voltage of the input buffer gate 12, wherein the breakdown voltage of the input buffer gate 12 is about 6 volts. Generally, a deep-sub-micron semiconductor device works under a regular driving voltage of about 3.3 volts or below. Hence, an ideal threshold voltage for the field device transistor 10 of the ESD protection circuit is about 3.3 to 6 volts.

Speaking of a regular transistor, the threshold voltage $V_T$ of an NMOS gate oxide with a thickness less than 200 Å is about 0.7 volts. Since the gate oxide layer of a field device transistor is thicker than that of a regular transistor, the threshold voltage of a field device transistor is normally as high as about 12 to 14 volts. Therefore, it is still an objective of the invention to thin the gate oxide layer of a field device transistor to lower the threshold voltage VT of the field device transistor to about 5 volts or below without suppressing the electrical properties of a field device.

In accordance with the foregoing and other objectives of the present invention, the invention provides a method for forming a field device transistor. The method of the invention starts with forming a pad oxide layer and then a silicon nitride layer on a substrate, and then patterning the pad oxide layer and silicon nitride layer to form an opening exposing the substrate. A field oxide layer is formed on the exposed substrate by performing a field oxidation process, wherein the field oxide layer is removed later on. An oxide layer is then formed on the exposed substrate by performing a thermal oxidation process. A gate oxide layer and a gate are formed and patterned on the oxide layer into sequence after the silicon nitride layer and pad oxide layer are removed. Then, source/drain regions are formed in the substrate next to the two lateral sides of the gate. An insulator containing a first contact hole and a second contact hole is formed on the substrate. The first contact hole exposes the source region, while the second contact hole exposes the gate and the drain region. The contact holes are then filled with a conducting layer formed on the insulator. A pattern containing the pattern of a first conducting line and the pattern of a second conducting line is transferred onto the conducting layer. The first conducting line is connected to the source region, while the second conducting line is connected to the gate and the drain region.

In accordance with the foregoing and other objectives of the present invention, the invention provides a second method for forming a field device transistor. The method of the invention starts with forming a pad oxide layer and then a silicon nitride layer on a substrate, and patterning the pad oxide layer and silicon nitride layer to form an opening exposing the substrate. By performing a field oxidation process, a field oxide layer is formed on the exposed substrate, wherein the field oxide layer is removed by a follow-up etch process. An oxide layer is then formed on the exposed substrate by performing a thermal oxidation process. Source/drain regions are formed in the substrate next to the two lateral sides of the oxide layer after the silicon nitride layer and pad oxide layer are removed. An insulator containing a first contact hole and a second contact hole is formed on the substrate. The first contact hole exposes the source region while the second contact hole exposes the drain region. The contact holes are then filled with a conducting layer formed on the insulator. A pattern containing the pattern of a first conducting line and the pattern of a second conducting line is transferred onto the conductive layer. The first conducting line is connected to the source region while the second conducting line is connected to the drain region, wherein a portion of the second conducting line over the oxide layer works as a gate.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new method for fabricating a field device transistor of a electrostatic discharge (ESD) protection circuit to ensure that the ESD protection circuit is able to bypass an abnormally high voltage before it is fed into the internal circuit. FIGS. 3A through 3F are schematic, cross-sectional views showing the method for fabricating a field device transistor of the first preferred embodiment according to the invention.

Figure 1:
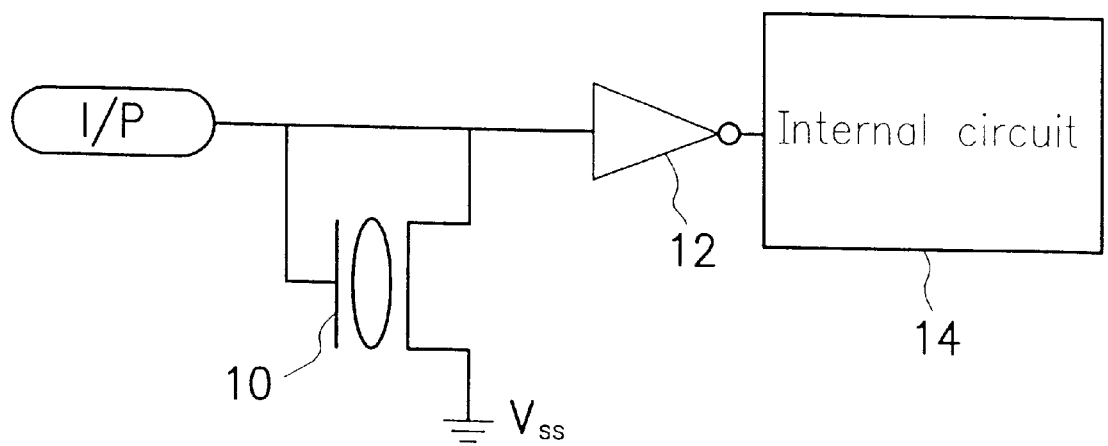
FIG. 1 is a schematic diagram showing a conventional electrostatic discharge protection circuit that contains a field device transistor.
Figure 2:
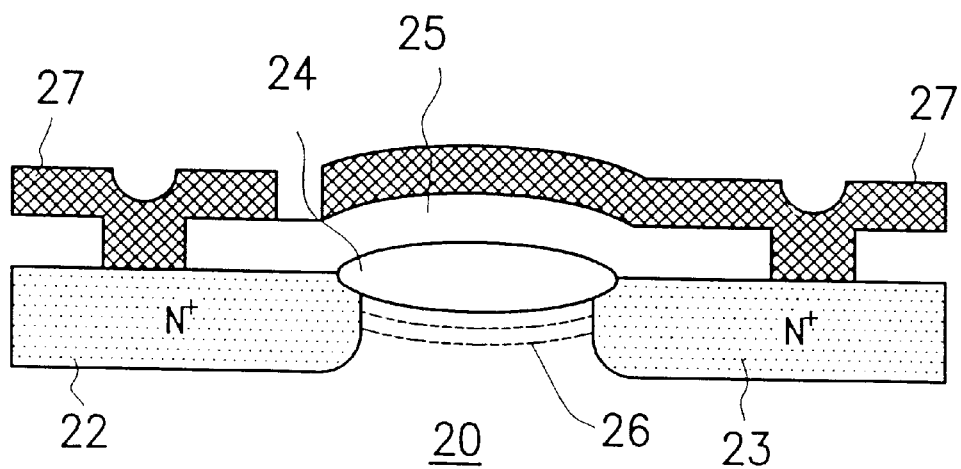
FIG. 2 is a schematic, cross-sectional view showing the structure of the field device transistor of the electrostatic discharge protection circuit shown in FIG. 1.
Figure 3A:
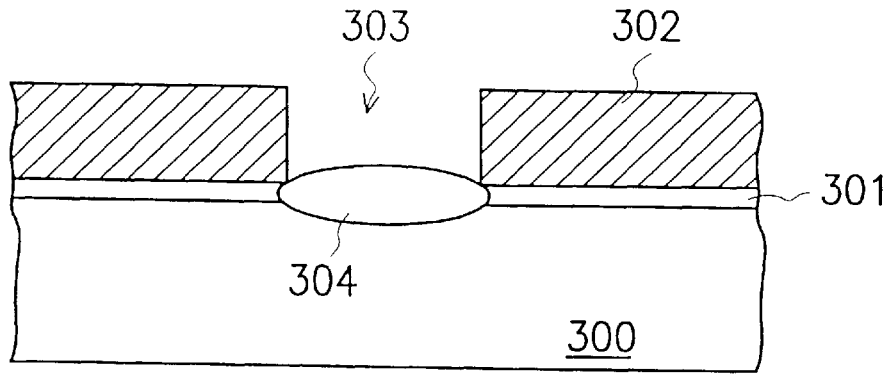
FIGS. 3A through 3F are schematic, cross-sectional views showing the field device transistor of the first preferred embodiment fabricated through a method according to the invention.

Referring to FIG. 3A, a pad oxide layer 301 and a silicon nitride layer 302 are formed on a provided substrate 300 in sequence, and then patterned to form a opening 303 exposing the substrate 300. By performing a field oxidation process, a field oxide layer 304 is formed on the exposed substrate 300 in the opening 303.

Figure 3B:
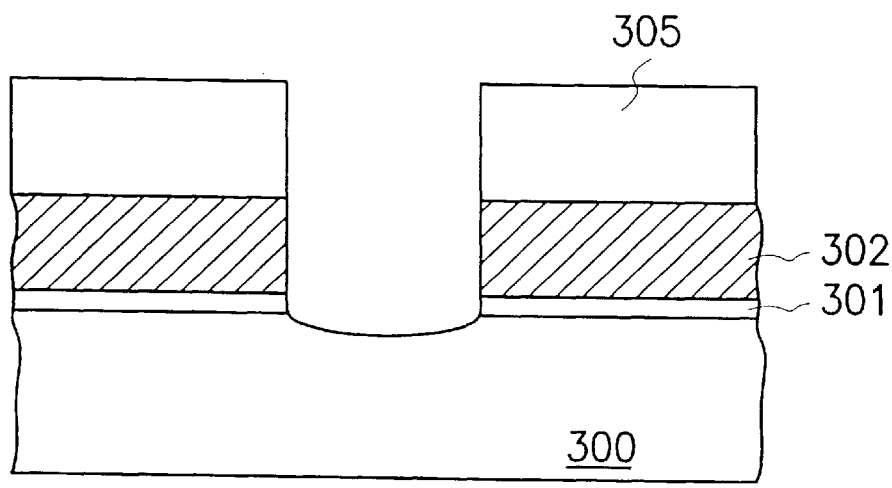

Referring next to FIG. 3B, a patterned mask layer 305 is formed on the silicon nitride layer 302 to expose the field oxide layer 304, wherein the mask layer 305 covers the entire internal circuit (not shown in figure). The mask layer 305 can be photoresist or other materials with similar properties. By performing an etching process along with using the substrate 300 as an etching end point, the field oxide layer 304 is removed from the substrate 300. Because of the presence of the mask layer 305, devices, such as field isolation, on the substrate 300 are protected from being etched away.

Figure 3C:
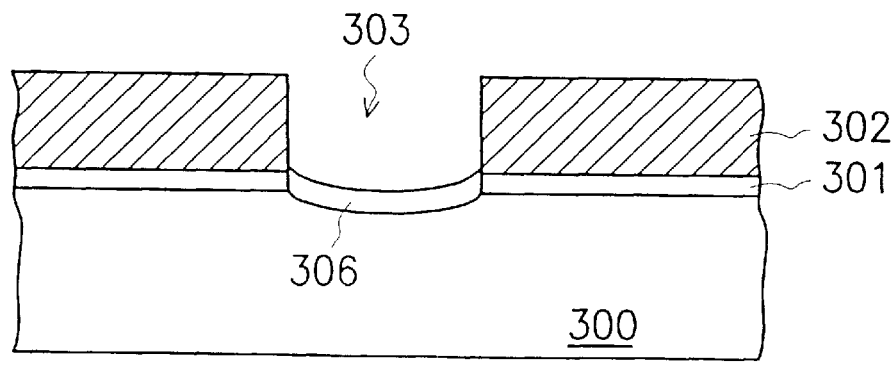

Referring to FIG. 3C, a thermal oxidation process is performed to form a first oxide layer 306 on the substrate 300 within the opening 303 after the mask layer 305 is removed. The thickness of the first oxide layer is about 1000 to 3000 Å.

Figure 3D:
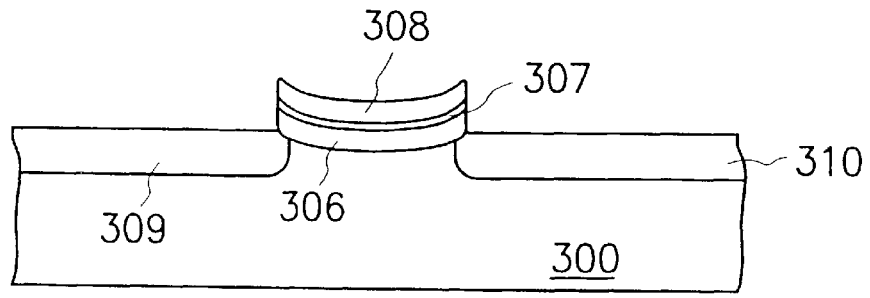

As shown in FIG. 3D, the silicon nitride layer 302 and the pad oxide layer 301 are removed from the substrate 300. Then, a thin gate oxide layer 307 and a gate conducting layer 308 are formed and patterned on the top of the first oxide layer 306 over the substrate 300. The gate conducting layer 308 can be polysilicon or other materials with similar properties. After the transistor gate that consists of the gate conducting layer 308 and the gate oxide layer 307 is complete, implantation processes are performed to form a source region 309 and a drain region 310 on the substrate 300 beside two opposite sides of the gate.

Figure 3E:
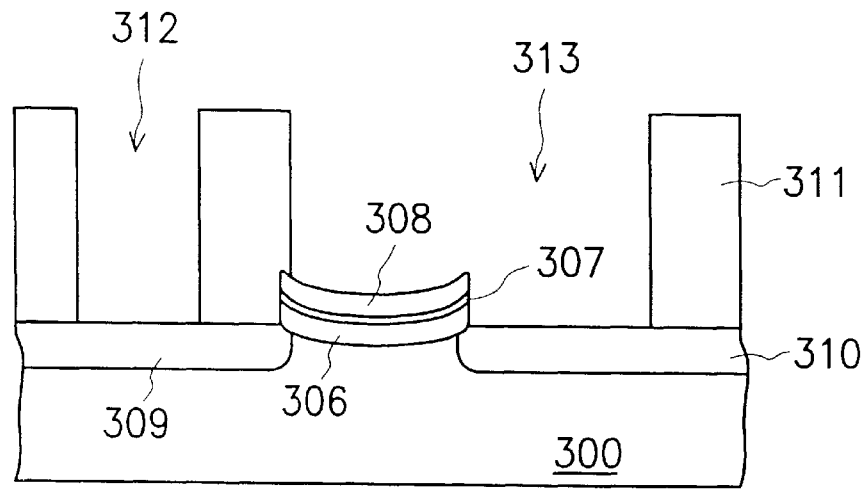

Then, as shown in FIG. 3E, a first insulator 311 is formed on the substrate 300, and patterned to form a first contact window 312 and a second contact window 313. The first contact window 312 exposes a portion of the source region 309, and in the meantime, the second contact window 313 exposes a portion of the drain region 310 and a portion of the gate conducting layer 308. The first insulator 311 can be borophosphosilicate glass (BPSG), tetrathylorthosilicate (TEOS), or other materials with similar properties.

Figure 3F:
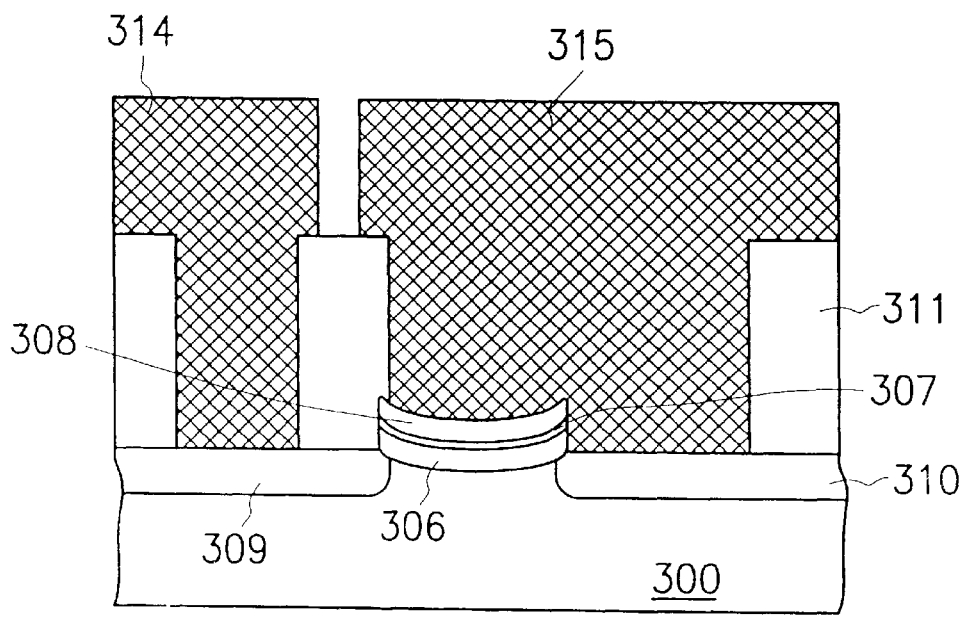

Referring to FIG. 3F, a first conducting layer, such as a metal layer, is formed on the substrate 300, and fills the first contact window 312 and the second contact window 313. The first conducting layer is later patterned to be first conducting wire 314 and a second conducting wire 315. The first conducting wire 314 is electrically connected to the source region 309 and the second conducting wire 315 is electrically connected to the drain region 310 and the gate conducting layer 308.

According to the foregoing, the threshold voltage $V_T$ of the field device transistor in the first preferred embodiment according to the invention can be varied by changing the thickness of the first insulator 306. An ideal $V_T$ for a field device transistor is lower than the breakdown voltage of the transistors of the internal circuit, and in the meantime, higher than the power supply $V_{DD}$. For example, by keeping the summed thickness of the gate oxide layer 307 and the first insulator 306 within a range of about 1000 to 3000 Å, the threshold voltage $V_T$ can be limited to between about 3.3 to 5 volts.

FIGS. 4A through 4G are schematic, cross-sectional views showing the method for fabricating a field device transistor in the second preferred embodiment according to the invention.

Figure 4A:
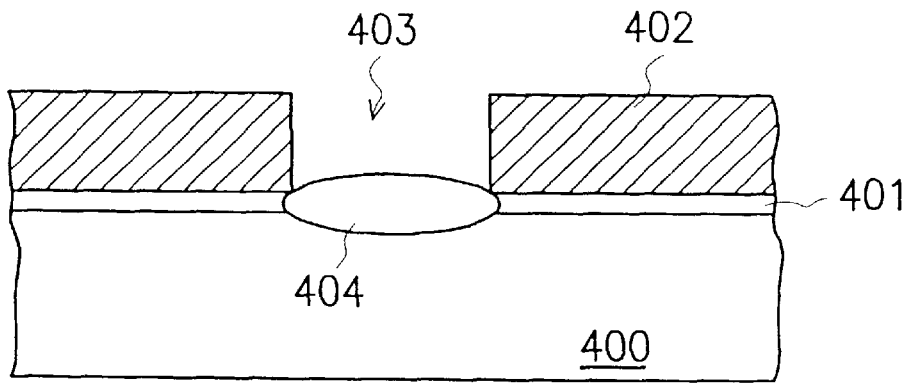
FIGS. 4A through 4G are schematic, cross-sectional views showing the field device transistor of the second preferred embodiment fabricated through a method according to the invention.

Referring to FIG. 4A, a pad oxide layer 401 and a silicon nitride layer 402 are formed on a provided substrate 400 in sequence, and then patterned to form an opening 403 exposing the substrate 400. By performing a field oxidation process, a field oxide layer 404 is formed on the exposed substrate 400 in the opening 403.

Figure 4B:
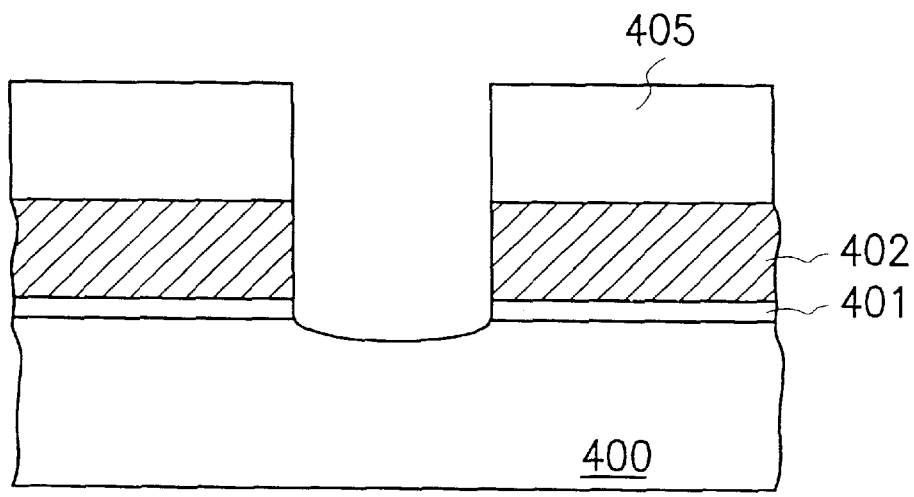

Referring next to FIG. 4B, a patterned mask layer 405 is formed on the silicon nitride layer 402 to expose the field oxide layer 404, wherein the mask layer 405 covers the entire internal circuit (not shown in figure). The mask layer 405 can be photoresist or other materials with similar properties. By performing an etching process that uses the substrate 400 as an etching end point, the field oxide layer 404 is removed from the substrate 400. Because of the presence of the mask layer 405, devices, such as field isolation, on the substrate 400 are protected from being etched away.

Figure 4C:
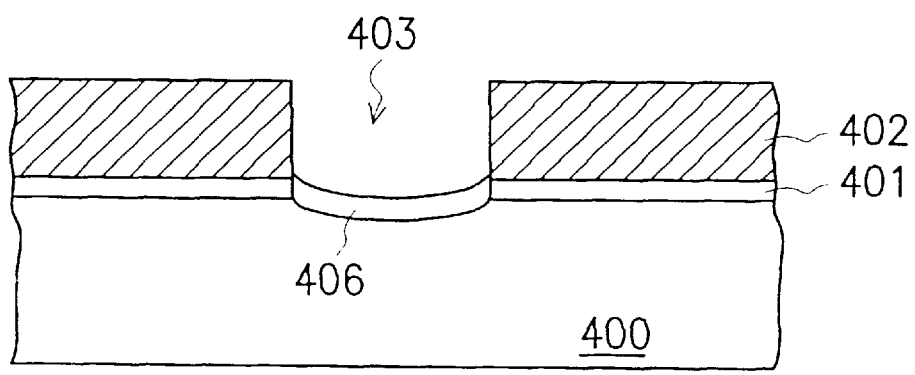
Figure 4D:
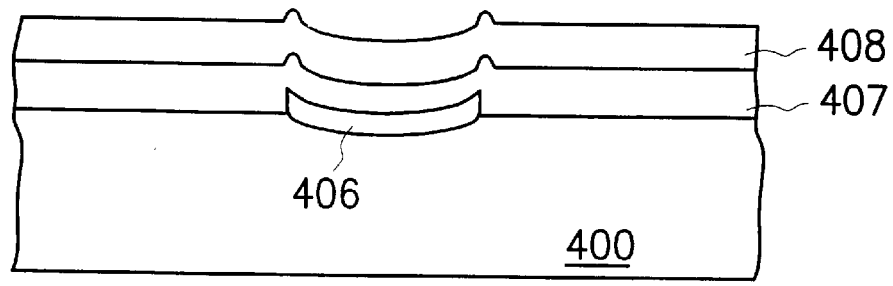

Referring to FIG. 4C, a thermal oxidation process is performed to form a first oxide layer 406 on the substrate 400 within the opening 403 after the mask layer 405 is removed. In FIG. 4D, the silicon nitride layer 402 and the pad oxide layer 401 are removed from the substrate 400. Then, a thin gate oxide layer 407 and a gate conducting layer 408 are formed and patterned on the top of the first oxide layer 406 over the substrate 400, wherein the gate conducting layer 408 can be polysilicon or other materials with similar properties.

Figure 4E:
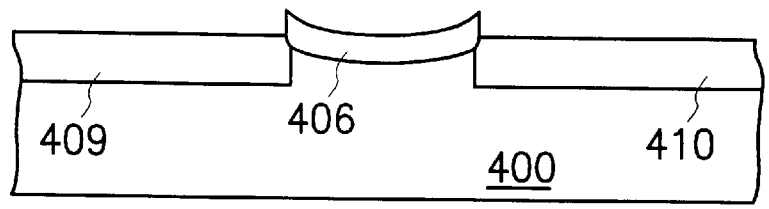

Referring to FIG. 4E, the gate conducting layer 408 and the gate oxide layer 407 are completely removed from the top of the substrate 400 by an etching process that is mainly performed to pattern the gate structure of a transistor of the internal circuit. Then, implantation processes are performed to form a source region 409 and a drain region 410 on the substrate 400 on two opposite sides of the first oxide layer 406.

Figure 4F:
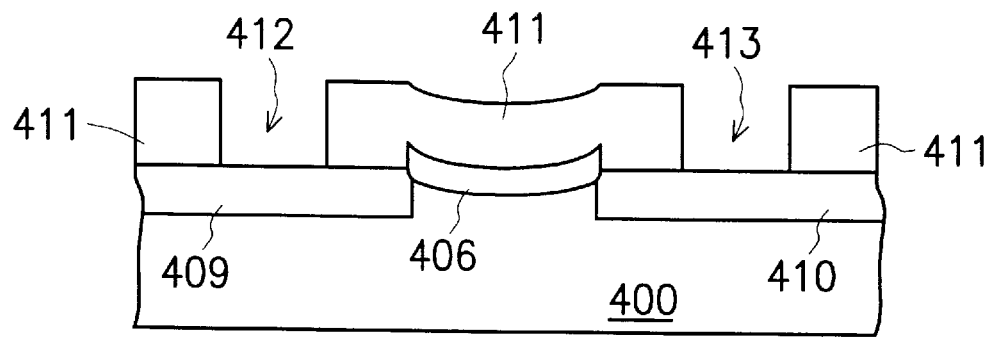

Then, as shown in FIG. 4F, a first insulator 411 is formed on the substrate 400, and patterned to form a first contact window 412 and a second contact window 413. The first contact window 412 exposes a portion of the source region 409, and in the meantime, the second contact window 413 exposes a portion of the drain region 410. The first insulator 411 can be borophosphosilicate glass (BPSG), tetrathylorthosilicate (TEOS), or other materials with similar properties.

Figure 4G:
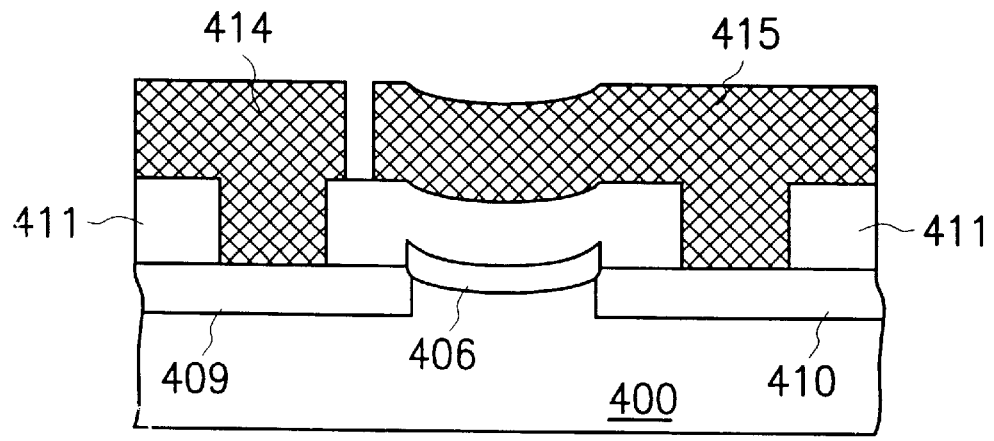

Referring to FIG. 4G, a first conducting layer, such as a metal layer, is formed on the substrate 400, and fills the first contact window 412 and the second contact window 413. The first conducting layer is later patterned to be first conducting wire 414 and a second conducting wire 415. The first conducting wire 414 is electrically connected to the source region 409, and the second conducting wire 415 is electrically connected to the drain region 410. A portion of the second conducting wire located over the first oxide layer 406 serves as a gate of the transistor of the invention.

According to the foregoing, the threshold voltage $V_T$ of the field device transistor in the second preferred embodiment according to the invention can be varied by changing the thickness of the first insulator 406. An ideal $V_T$ of a field device transistor is lower than the breakdown voltage of the transistor of the internal circuit, and in the meantime, higher than the power supply $V_{DD}$. For example, by keeping the summed thickness of the first oxide layer 406 and the first insulator 411 within a range of about 1000 to 3000 Å, the threshold voltage $V_T$ can be limited to between about 3.3 to 5 volts.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a field device transistor, comprising:

forming a pad oxide layer on a substrate;

forming a silicon nitride layer on the pad oxide layer;

patterning the silicon nitride layer and the pad oxide layer to form an opening exposing the substrate;

performing a field oxidation process to form a field oxide layer on the substrate within the opening;

forming a mask layer on the silicon nitride layer, wherein the mask layer exposes the field oxide layer;

performing an etching process to remove the field oxide layer from the substrate;

removing the mask layer;

performing a thermal oxidation process to form an oxide layer on the substrate within the opening;

removing the silicon nitride layer and the pad oxide layer;

forming a thin gate oxide layer and a gate conducting layer on the substrate and patterning the thin gate oxide layer and the gate conducting layer over the oxide layer, wherein the thin gate oxide layer and the gate conducting layer compose a gate;

performing an implantation process to form a source region and a drain region on the substrate, wherein the source region and the drain region are located on two opposite sides of the gate conducting layer;

forming a patterned insulator over the substrate, wherein the insulator comprises a first contact window exposing the source region, and a second contact window exposing the drain region and the gate conducting layer;

forming a conducting layer on the first insulator, wherein the conducting layer fills the first contact window and the second contact window; and patterning the conducting layer to form a first conducting wire and a second conducting wire, wherein the first conducting wire is electrically connected to the source region, and the second conducting wire is electrically connected to the drain region and the gate conducting layer.

2. The method of claim 1, wherein the mask layer includes photoresist.

3. The method of claim 1, wherein the oxide layer is about 1000 to 3000 Å thick.

4. The method of claim 1, wherein the gate conducting layer includes polysilicon.

5. The method of claim 1, wherein the insulator includes borophosphosilicate glass (BPSG).

6. The method of claim 1, wherein the insulator includes tetrathylorthosilicate (TEOS).

7. The method of claim 1, wherein the conducting layer includes metal.

8. A method for fabricating a field device transistor, comprising:

forming a pad oxide layer on a substrate;

forming a silicon nitride layer on the pad oxide layer;

patterning the silicon nitride layer and the pad oxide layer to form an opening exposing the substrate;

performing a field oxidation process to form a field oxide layer on the substrate within the opening;

forming a mask layer on the silicon nitride layer, wherein the mask layer exposes the field oxide layer;

performing an etching process to remove the field oxide layer from the substrate;

removing the mask layer;

performing a thermal oxidation process to form an oxide layer on the substrate within the opening;

removing the silicon nitride layer and the pad oxide layer;

performing an implantation process to from a source region and a drain region on the substrate, wherein the source region and the drain region are located on two opposite sides of the oxide layer;

forming a patterned insulator over the substrate, wherein the insulator comprises a first contact window exposing the source region and a second contact window exposing the drain region;

forming a conducting layer on the first insulator, wherein the conducting layer fills the first contact window and the second contact window; and patterning the conducting layer to form a first conducting wire and a second conducting wire, wherein the first conducting wire is electrically connected to the source region, and the second conducting wire is electrically connected to the drain region, and wherein a portion of the second conducting wire over the oxide layer serves as a gate of the field device transistor.

9. The method of claim 8, wherein the step of removing the silicon nitride layer and the pad oxide layer is further followed by steps of:

forming a gate oxide layer on the substrate;

forming a gate conducting layer on the gate oxide layer; and patterning the gate conducting layer and the gate oxide layer, wherein the gate conducting layer and the gate oxide layer are totally removed from the top of the field device transistor.

10. The method of claim 8, wherein the mask layer includes photoresist.

11. The method of claim 8, wherein the insulator includes borophosphosilicate glass (BPSG).

12. The method of claim 8, wherein the insulator includes tetrathylorthosilicate (TEOS).

13. The method of clam 8, wherein the conducting layer includes metal.

14. The method of claim 8, wherein the oxide layer and the insulator together are about 1000 to 3000 Å thick.

* * * * *